United States Patent
Furukuwa

(10) Patent No.: US 6,730,856 B2
(45) Date of Patent: May 4, 2004

(54) CERAMIC CIRCUIT BOARD AND METHOD FOR MANUFACTURING THE SAME

(75) Inventor: Ken Furukuwa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/223,973

(22) Filed: Aug. 20, 2002

(65) Prior Publication Data

US 2003/0056981 A1 Mar. 27, 2003

(30) Foreign Application Priority Data

Sep. 27, 2001 (JP) .................... P2001-296625

(51) Int. Cl.[7] .................... H05K 1/00; H05K 1/09
(52) U.S. Cl. .................... 174/256; 174/258; 174/261; 174/262; 174/264
(58) Field of Search .................... 174/258, 254, 174/255, 256, 261, 264, 260; 361/792, 795, 760

(56) References Cited

U.S. PATENT DOCUMENTS 4,131,516 A * 12/1978 Bakos et al. .................... 29/832
4,925,024 A * 5/1990 Ellenberger et al. .................... 174/52.4

FOREIGN PATENT DOCUMENTS

| GB | 588651 A1 | * 3/1994 |
| JP | 6-13726 | 1/1994 |
| JP | 406120634 A | * 4/1994 |
| JP | 406120635 A | * 4/1994 |
| JP | 10-125824 | 5/1998 |
| JP | 11-340600 | 12/1999 |

* cited by examiner

*Primary Examiner*—David A. Zarneke
*Assistant Examiner*—J B Patel
(74) *Attorney, Agent, or Firm*—Hogan & Hartson

(57) ABSTRACT

In the ceramic circuit board, within the through hole of the ceramic substrate is arranged the metal column which is 0 to 150 μm shorter relative to the thickness of the ceramic substrate; the metal circuit plates are attached to both surfaces of the ceramic substrate to stop up the through hole; and the metal column and the metal circuit plate are bonded together via the brazing material. For its manufacture, the metal column with brazing material is used that is made 40 to 140 μm longer relative to the thickness of the ceramic substrate by being formed of the metal column which is 0 to 150 μm shorter relative to the thickness of the ceramic substrate and has its both ends coated with the brazing material.

9 Claims, 3 Drawing Sheets

CERAMIC CIRCUIT BOARD AND METHOD FOR MANUFACTURING THE SAME

BACKGROUND OF THE INVENTION

1. Field of the Invention

The present invention relates to a ceramic circuit board which is constructed by a ceramic substrate and metal circuit plates attached to both surfaces of the ceramic substrate.

The invention also relates to a ceramic circuit board which is constructed by a ceramic substrate, metal circuit plates attached to both surfaces of the ceramic substrate, and a metal column arranged within the ceramic substrate to connect the two metal circuit plates, and to a method for manufacturing said ceramic circuit board.

2. Description of the Related Art

In recent years, as circuit boards such as power module boards and switching module boards, ceramic circuit boards have come into common use. The examples thereof include: a ceramic circuit board constructed by bonding a metal circuit plate made of copper or the like to a metallized layer coated onto a ceramic substrate, via abrazing material such as a silver-copper alloy; a ceramic circuit board constructed by directly bonding a metal circuit plate made of copper or the like onto a ceramic substrate, via an active metal brazing material obtained by adding titanium, zirconium, hafnium, or its hydride to a silver-copper eutectic alloy; and a ceramic circuit board constructed in accordance with the so-called DBC (Direct Bond Copper) method, in which a copper plate is placed onto a ceramic substrate, and the ceramic substrate and the copper plate are directly bonded together by application of heat.

In one aspect of the prior art, in those ceramic circuit boards, in order to increase the mounting density of the metal circuit plate, the metal circuit plate is bonded both on the upper surface and on the lower surface of the ceramic substrate, and the upper and lower metal circuit plates are electrically connected to each other by a metal column arranged within a through hole formed in the ceramic substrate.

Among the aforementioned ceramic circuit boards, for example, the one constructed by directly bonding a metal circuit plate made of copper, etc. onto a ceramic substrate via an active metal brazing material is fabricated as follows. Firstly, there is prepared a ceramic substrate made of an electrically insulating material such as sintered aluminum oxide, sintered aluminum nitride, sintered silicon nitride, or sintered mullite. The ceramic substrate has a through hole drilled therethrough in the thickness direction. Secondly, a metal column is arranged within the through hole, and a brazing material paste, which is obtained by mixedly adding an organic composition or solvent to silver brazing filler powder (powder of silver-copper alloy), is applied to each end face of the metal column. Then, a metal circuit plate of predetermined pattern is placed in abutment with the ceramic substrate, with a brazing material sandwiched therebetween, such as an active metal brazing material obtained by adding at least one of titanium, zirconium, hafnium, and their hydrides to a silver-copper alloy. Lastly, the assembly thus obtained is heated in a reducing atmosphere at a temperature of approximately 900° C. to melt the brazing material paste and the brazing material. Thereby, the metallized layer and the metal circuit plate are bonded together via the active metal brazing material, and also the metal circuit plate and the metal column are bonded together via a brazing material such as a silver brazing filler.

The ceramic circuit board thus fabricated is, after mounting thereon an electronic component such as a semiconductor device, for example an IGBT (Insulated Gate Bipolar Transistor) or an MOS-FET (Metal Oxide Semiconductor-Field Effect Transistor), using an adhesive such as solder, assembled into a resin case having an integrally-molded external input/output terminal, thereby realizing a semiconductor module. This semiconductor module finds a wider range of applications involving industrial equipment such as a robot, an actuator of an electric train, an electric vehicle, and the like, and is therefore required to operate with a high degree of reliability under harsh environments.

The conventional ceramic circuit boards, however, have the following disadvantages. If the length of the metal column is greater than the thickness of the ceramic substrate, a brazing material is absent in between the metal column and the metal circuit plate, or it is present little in quantity, if any. In this state, the metal column and the metal circuit plate are connected to each other with poor reliability, with the result that an electronic component such as a semiconductor device, which is mounted on the metal circuit plate, is unable to operate normally with stability. Moreover, if the metal column is made unduly long, it thrusts up the metal circuit plate, and consequently part of the metal circuit plate located near the metal column rises and becomes out of touch with the ceramic substrate. This causes imperfect bonding of the metal circuit plate to the ceramic substrate, resulting in the ceramic circuit board being poor in reliability.

By contrast, if the length of the metal column is smaller than the thickness of the ceramic substrate, it is difficult to supply an adequate amount of a brazing material paste, which is print-coated on the upper and lower surfaces of the metal column. If the brazing material paste is in short supply, the metal column and the metal circuit plate cannot be connected to each other by the brazing material, with the result that the ceramic circuit board is brought into an electrically opened state and thus fails to function properly. Even if the metal column can be connected to the metal circuit plate, the brazing material portion existing therebetween is so thin that it sustains high continuity resistance. Consequently, heat is generated locally at the time of energization, and this interferes with the proper and stable operation of an electronic component, such as a semiconductor devices, which is mounted on the ceramic circuit board.

In another aspect of the prior art, in those conventional ceramic circuit boards, in order to increase the mounting density of the metal circuit plate, the metal circuit plate is bonded both on the upper surface and on the lower surface of the ceramic substrate, and the upper and lower metal circuit plates are electrically connected to each other by a brazing material filled in a through hole formed in the ceramic substrate.

The aforementioned ceramic circuit boards, for example, the ceramic circuit board constructed by bonding a metal circuit plate made of copper, etc. to a metallized layer coated onto a ceramic substrate via a brazing material is fabricated as follows. Firstly, there is prepared a ceramic substrate made of an electrically insulating ceramic material such as sintered aluminum oxide, sintered aluminum nitride, sintered silicon nitride, or sintered mullite. The ceramic substrate has, on each of its upper and lower surfaces, a metallized layer of predetermined pattern, and also has a through hole drilled therethrough in the thickness direction. Secondly, the through hole of the ceramic substrate is filled with a brazing material paste obtained by mixedly adding an organic composition or solvent to silver brazing filler powder (powder of silver-copper alloy). Then, a metal circuit plate of predetermined pattern is placed in abutment with the metallized layer, with a brazing material such as a silver brazing filler sandwiched therebetween. Lastly, the assembly thus obtained is heated in a reducing atmosphere at a temperature of approximately 900° C. to melt the brazing material paste and the brazing material. As a result, the brazing material, such as a silver brazing filler, serves to bond together the metallized layer and the metal circuit plate, and also bond together the upper and lower metal circuit plates of the ceramic substrate.

This conventional ceramic circuit board, however, poses the following problem. In the construction, the two metal circuit plates bonded to the upper and lower surfaces of the ceramic substrate are electrically connected to each other by the brazing material filled in the through hole formed in the ceramic substrate. Furthermore, the through hole formed in the ceramic substrate is filled with a brazing material paste obtained by mixedly adding an organic composition or solvent to silver brazing filler powder (powder of silver-copper alloy), and subsequently heating treatment is performed thereon at a temperature of approximately 900° C. In this case, air existing between the individual silver brazing filler particles is contained in large quantity in the molten silver brazing filler, and the brazing material accordingly has a porous structure and its continuity resistance is as high as 7 to 10 $\mu\Omega$·cm in terms of resistivity. Thus, in the conventional ceramic circuit board, when large electric current exceeding 10A flows through the metal circuit plate and the brazing material filled in the through hole, the brazing material portion filled in the through hole undergoes resistive heat generation, and the resultant heat undesirably acts upon an electronic component, such as a semiconductor device, which is bond-fixed onto the metal circuit plate via an adhesive such as solder. As a result, the electronic component cannot be operated stably under an unduly high temperature.

SUMMARY OF THE INVENTION

The invention has been devised in view of the above-described problems with the conventional art, and one object of the invention is to provide a highly reliable ceramic circuit board in which a metal circuit plate and a ceramic substrate, as well as a metal column and the metal circuit plate, can be bonded together properly.

Another object of the invention is to provide a method for manufacturing a ceramic circuit board in which a metal circuit plate and a ceramic substrate, as well as a metal column and the metal circuit plate, can be bonded together properly with reliability, so that highly reliable electrical bonding is achieved between the metal column and the metal circuit plate.

Still another object of the invention is to provide a ceramic circuit board in which liberation of considerable amounts of heat, ascribable to resistive heat generation, can be prevented effectively, and an electronic component such as a semiconductor device, which is connected to a metal circuit plate, can be kept at a suitable temperature constantly so as to be operated normally and stably.

The invention provides a ceramic circuit board comprising:
a ceramic substrate having a through hole;
a metal column arranged within the through hole, the metal column being made 0 to 150 $\mu$m shorter relative to a thickness of the ceramic substrate;
metal circuit plates attached to both surfaces of the ceramic substrate in such a way as to stop up the through hole; and
a brazing material interposed between the metal column and the metal circuit plate, for bonding together the metal column and the metal circuit plate.

According to the invention, since the metal column is made 0 to 150 $\mu$m shorter relative to the thickness of the ceramic substrate, it never occurs that the metal column thrusts up the metal circuit plate, and thus the metal circuit plate can be bonded to the ceramic substrate properly. Besides, since a sufficient amount of brazing material exists in between the metal column and the metal circuit plate, the metal column and the metal circuit plate can be bonded together properly, thereby realizing a highly reliable ceramic circuit board.

The invention also provides a method for manufacturing a ceramic circuit board, comprising the steps of:
preparing a ceramic substrate having a through hole, a metal column with brazing material, and at least two pieces of metal circuit plates, said metal column with brazing material being made 40 to 140 $\mu$m longer relative to a thickness of the ceramic substrate, by coating both ends of a metal column which is 0 to 150 $\mu$m shorter relative to the thickness of the ceramic substrate, with a brazing material;
arranging the metal column with brazing material within the through hole of the ceramic substrate, and arranging the metal circuit plates on both surfaces of the ceramic substrate in such a way as to stop up the through hole; and
bonding, after melting the brazing material by heating, the metal column and the metal circuit plates together via the molten brazing material.

According to the invention, within the through hole of the ceramic substrate is arranged a metal column with brazing material that is made 40 to 140 $\mu$m longer relative to the thickness of the ceramic substrate, by coating both ends of a metal column which is 0 to 150 $\mu$m shorter relative to the thickness of the ceramic substrate, with a brazing material. With this arrangement, at the time of arranging the metal circuit plates on both surfaces of the ceramic substrate in such a way as to stop up the through hole, the metal column with brazing material is brought into contact with the metal circuit plates without fail. Moreover, since the metal column and the metal circuit plates are bonded together via an adequate amount of brazing material, the continuity resistance as observed in the junction therebetween can be kept sufficiently low, whereby making it possible to fabricate a ceramic circuit board that is free from local heat generation caused at the time of energization, and is capable of operating a component mounted thereon normally with stability. Further, since an adequate amount of brazing materials are coated at both ends of the metal column in advance, variation in the amount of the brazing material can be suppressed, resulting in an advantage in ensuring stability in the bonding status and configuration of the construction. As a result, highly reliable electrical bonding can be achieved.

In the invention, it is preferable that the metal circuit plate is made of copper or aluminum.

In the invention, it is preferable that the metal column is made of copper or aluminum.

According to the invention, since the metal circuit plate and the metal column are each made of copper or aluminum, even if large electric current flows through the metal circuit plate or the metal column, none of the metal circuit plate, the metal column, and the junction therebetween liberates considerable amounts of heat due to Joule effect. As a result, an electronic component such as a semiconductor device, bond-fixed onto the metal circuit plate using an adhesive such as solder, can be kept at a suitable temperature constantly so as to be operated normally and stably for a longer period of time.

In the invention, it is preferable that a space secured between an inner wall surface of the through hole and an outer wall surface of the metal column is kept in a range of 30 to 200 µm in length.

According to the invention, the space secured between the inner wall surface of the through hole and the outer wall surface of the metal column is kept in a range of 30 to 200 µm in length. With this configuration, when heat is applied to the ceramic circuit board, the inner wall surface of the through hole can be prevented from being undesirably pressed and expanded by the outer wall surface of the metal column because of the difference in thermal expansion coefficient between the ceramic substrate and the metal column. This helps prevent occurrence of crack or fracture in the ceramic substrate. Moreover, when inserted into the through hole, the metal column can be prevented from being tilted. Hence, the metal circuit plate and the metal column can be connected to each other without fail.

The invention further provides a ceramic circuit board comprising:

a ceramic substrate having a through hole;

a metal column arranged within the through hole; and metal circuit plates attached to both surfaces of the ceramic substrate in such a way as to stop up the through hole, wherein the metal circuit plates attached to both surfaces of the ceramic substrate are connected to each other by the metal column, and wherein, between an inner wall surface of the through hole and an outer wall surface of the metal column is secured a space which is 30 to 200 µm long.

According to the invention, a 30 to 200 µm-long space is secured between the inner wall surface of the ceramic substrate's through hole and the outer wall surface of the metal column. Thus, even if, when heat is applied to the ceramic circuit board, the outer wall surface of the metal column is expanded and swollen due to the difference in thermal expansion coefficient between the ceramic substrate and the metal column, the resultant expansion can be successfully accommodated by the space. This helps prevent the inner wall surface of the through hole from being pressed and expanded by the outer wall surface of the metal column, and thereby prevent occurrence of crack or fracture in the ceramic substrate. As a result, the ceramic circuit board can be operated normally and stably for a longer period of time.

In the invention, it is preferable that the metal circuit plate is made of copper or aluminum.

In the invention, it is preferable that the metal column is made of copper or aluminum.

According to the invention, the copper- or aluminum-made metal circuit plates, attached to both surfaces of the ceramic substrate, are electrically connected to each other by the metal column arranged within the through hole of the ceramic substrate, said metal column being made of copper or aluminum containing little pores and having a resistivity of 3 µΩ·cm or below. By so doing, even if large electric current exceeding 10A flows through the metal circuit plate and the metal column, there occurs no liberation of considerable amounts of heat ascribable to resistive heat generation. As a result, an electronic component such as a semiconductor device, bond-fixed onto the metal circuit plate using an adhesive such as solder, can be kept at a suitable temperature constantly so as to be operated normally and stably for a longer period of time.

In the invention, it is preferable that the metal circuit plate has its surface plated with a layer made of nickel.

According to the invention, the metal circuit plate has its surface plated with a nickel-made layer which exhibits excellent conductivity, is highly corrosion-resistant, and has excellent wettability with respect to a brazing material. This makes it possible to effectively protect the metal circuit plate against oxidative corrosion, and to strengthen the electrical connection between the metal circuit plate and an external electric circuit and the connection between an electronic component such as a semiconductor device and the metal circuit plate.

In the invention, it is preferable that the plate layer is made of a nickel-phosphorus amorphous alloy containing phosphorus in an amount of 8 to 15 wt %.

According to the invention, the plate layer is made of a nickel-phosphorus amorphous alloy containing phosphorus in an amount of 8 to 15 wt %. This makes it possible to protect the surface of the plate layer against oxidation and thus maintain the wettability with respect to the solder for a longer period of time.

In the invention, it is preferable that the plate layer is 1.5 to 3 µm thick.

According to the invention, since the plate layer is 1.5 to 3 µm thick, the entire surface of the metal circuit plate is completely coated, whereby making it possible to effectively protect the metal circuit plate against oxidative corrosion, to suppress an undesirable increase in the internal stress developed inside the plate layer, and to prevent occurrence of warpage or crack in the ceramic substrate.

In the invention, it is preferable that the metal column has a diameter of 200 µm or above.

According to the invention, since the diameter of the metal column is set at 200 µm or above, even if large electric current exceeding 10A flows through the metal column, there occurs no liberation of considerable amounts of heat ascribable to resistive heat generation. As a result, an electronic component such as a semiconductor device, bond-fixed onto the metal circuit plate using an adhesive such as solder, can be kept at a suitable temperature constantly so as to be operated normally and stably for a longer period of time.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
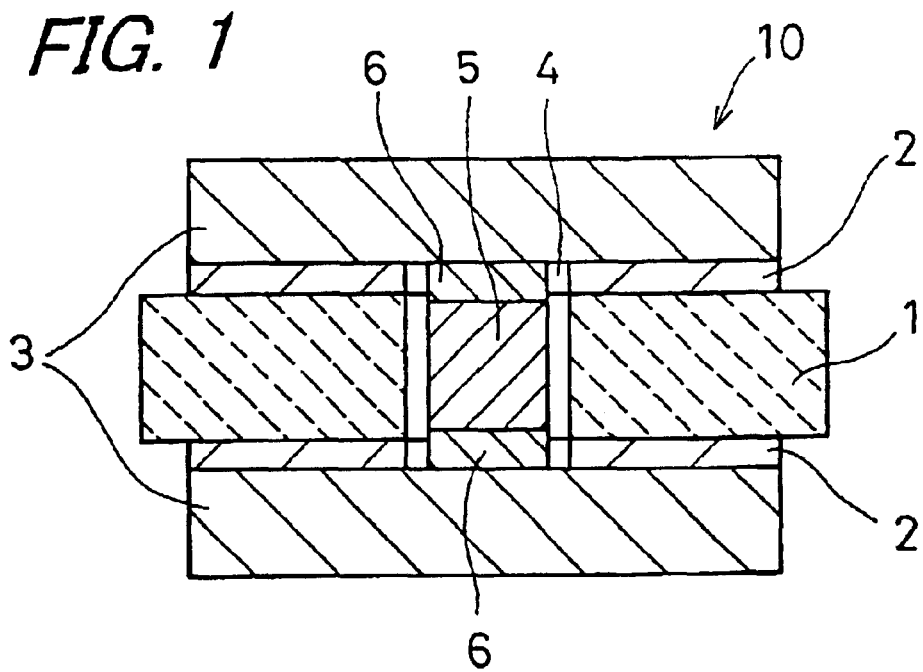
FIG. 1 is a sectional view showing one embodiment of a ceramic circuit board according to the invention.

Now referring to the drawings, preferred embodiments of the invention are described below.

FIG. 1 is a sectional view showing one embodiment of a ceramic circuit board according to the invention. The ceramic circuit board 10 includes a ceramic substrate 1 having a through hole 4; an active metal brazing material 2; a metal circuit plate 3; a metal column 5; and a brazing material 6. In this ceramic circuit board 10, the ceramic substrate 1 has, on both of its one. surface and the other surface opposite thereto, the metal circuit plate 3 of predetermined pattern attached via the active metal brazing material 2. The ceramic substrate 1 also has the through hole 4 drilled therethrough in the thickness direction. Within the through hole 4 is arranged the metal column 5, with its both end faces respectively bonded via the brazing material 6 to the metal circuit plate 3.

The metal column 5, arranged within the through hole 4 formed in the ceramic substrate 1, has its both ends respectively bonded via the brazing material 6 to the metal circuit plate 3. With this arrangement, the two metal circuit plates 3, attached both on the upper surface and on the lower surface of the ceramic substrate 1, are electrically connected to each other via the metal column 5 and the brazing material 6.

The ceramic substrate 1 having the through hole 4 is made of an electrically insulating material such as sintered aluminum oxide, sintered mullite, sintered silicon nitride, sintered aluminum nitride, or sintered silicon carbide. In the case of using sintered silicon nitride, the ceramic substrate 1 is fabricated as follows. Firstly, a suitable organic binder, plasticizer, or solvent is mixedly added to a starting powder material, such as silicon nitride, aluminum oxide, magnesium oxide, or yttrium oxide, to form a slurry. The slurry is then formed into a ceramic green sheet (ceramic raw sheet) by the conventionally-known doctor blade method or calendar roll method. Secondly, the ceramic green sheet is subjected to an appropriate stamping process so as to assume a predetermined shape, and a plurality of the sheets are stacked one upon another as required to form a molded body. Lastly, the molded body is fired in a non-oxidative atmosphere, such as an atmosphere containing nitrogen gas, at a high temperature of approximately 1600 to 2000° C. For example, the ceramic substrate 1 thus obtained has a thickness in a range of ca. 0.3 to 1.0 mm, or typically a thickness of ca. 0.635 mm.

The active metal brazing material 2 is made of a silver-copper eutectic alloy added with a metal substance such astitanium, zirconium, orhafnium, oritshydride, inanamount of 2 to 5 wt %, or made of an aluminum-silicon eutectic alloy added with a metal substance such as titanium, zirconium, or hafnium, or its hydride, in an amount of 2 to 5 wt %.

The metal circuit plate 3, which is made of copper or aluminum, is formed by subjecting a copper or aluminum ingot (block) to a conventionally-known metal processing method such as a rolling process or stamping process. The metal circuit plate 3 is formed in a predetermined pattern, with a thickness of 500 $\mu$m for example.

In the case of using copper, the metal circuit plate 3 should preferably be made of oxygen-free copper in particular. The metal circuit plate 3 made of oxygen-free copper is free from copper-surface oxidation caused by oxygen existing within the copper. Therefore, when attached via the active metal brazing material 2, the metal circuit plate 3 exhibits excellent wettability with respect to the active metal brazing material 2. As a result, the metal circuit plate 3 can be firmly bonded via the active metal brazing material 2 to the ceramic substrate 1.

The metal column 5 should preferably be made of highly conductive metal, for example copper or aluminum having considerably low resistivity of 3 $\mu\Omega$·cm or below (copper: 1.72 $\mu\Omega$·cm; aluminum: 2.65 $\mu\Omega$·cm). By so doing, even if large electric current flows through the metal column 5, none of the metal circuit plate 3, the metal column 5, and the junction therebetween liberates considerable amounts of heat due to Joule effect. As a result, an electronic component such as a semiconductor device, bond-fixed onto the metal circuit plate 3 using an adhesive such as solder, can be kept at a suitable temperature constantly so as to be operated normally and stably for a longer period of time.

In the case of using copper, the metal column 5 should preferably be made of oxygen-free copper in particular. The metal column 5 made of oxygen-free copper is free from copper-surface oxidation caused by oxygen existing within the copper. Therefore, when braze-bonded, the metal column 5 exhibits excellent wettability with respect to the active metal brazing material 2. As a result, the metal circuit plate 3 can be firmly bonded via the active metal brazing material 2 to the ceramic substrate 1.

The brazing material 6 is, as will be described later, made of a silver brazing filler or aluminum brazing filler.

In the ceramic circuit board 10 embodying the invention, it is important that the metal column 5 should be made 0 to 150 $\mu$m shorter in length relative to the thickness of the ceramic substrate 1. If the length of the metal column 5 is greater than the thickness of the ceramic substrate 1, the metal column 5 inconveniently thrusts up the metal circuit plates 3 attached to both surfaces of the ceramic substrate 1. This causes imperfect bonding of each of the metal circuit plates 3 to the ceramic substrate 1. By contrast, if the length of the metal column 5 is shorter by an amount greater than 150 $\mu$m relative to the thickness of the ceramic substrate 1, a larger amount of brazing material 6 needs to be coated on the metal column 5, resulting in an undesirable increase in the cost required for preparing a metal column 7 with the brazing material 6. In this case, moreover, the metal column 5 tends to be moved upward and downward or tilted at the time of melting the brazing material 6 by heating. This makes it difficult to bond together the metal column 5 and the metal circuit plate 3 satisfactorily.

Moreover, the length of the space secured between the inner wall surface of the through hole 4 and the outer wall surface of the metal column 5 (equivalent to the difference in radius between the through hole 4 and the metal column 5) should preferably be kept in a range from 30 to 200 $\mu$m. If the length of the space is less than 30 $\mu$m, at the time of applying heat to the ceramic circuit board 10, it is difficult for the space between the inner wall surface of the ceramic substrate 1's through hole 4 and the outer wall surface of the metal column 5 to securely accommodate the expansion of the inner wall surface of the through hole 4 of the substrate 1, which is caused by the outer wall surface of the metal column 5 swollen due to the difference in thermal expansion coefficient between the ceramic substrate 1 and the metal column 5. Consequently, the inner wall surface of the ceramic substrate 1's through hole 4 is pressed and expanded by the outer wall surface of the metal column 5, causing crack or fracture in the ceramic substrate 1. By contrast, if the length of the space exceeds 200 $\mu$m, the metal column 5 with the brazing material 6 is inconveniently tilted when inserted into the through hole 4 of the ceramic substrate 1, with the result that the metal column 5 cannot be securely connected to the metal circuit plate 3.

Figure 2A:
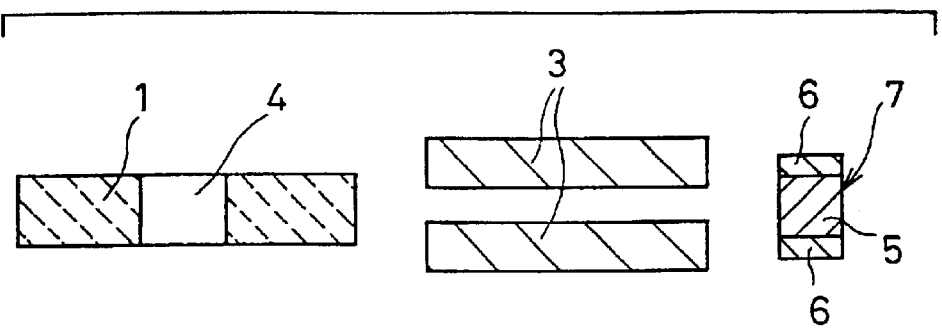
FIGS. 2A through 2C are sectional views showing one embodiment of a method for manufacturing a ceramic circuit board according to the invention, in a step-by-step manner.
Figure 2B:
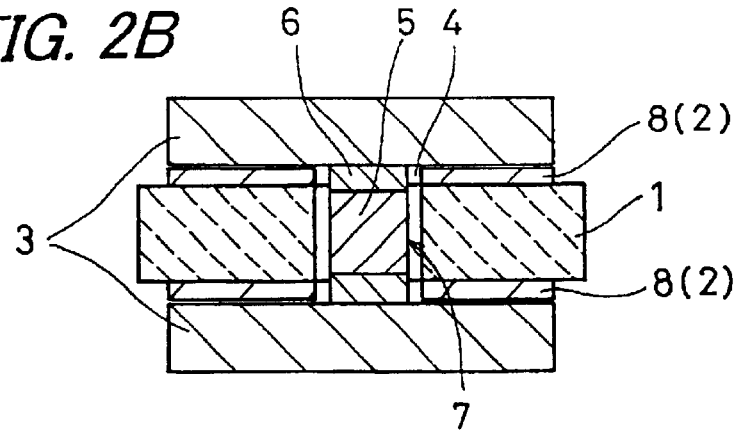
Figure 2C:
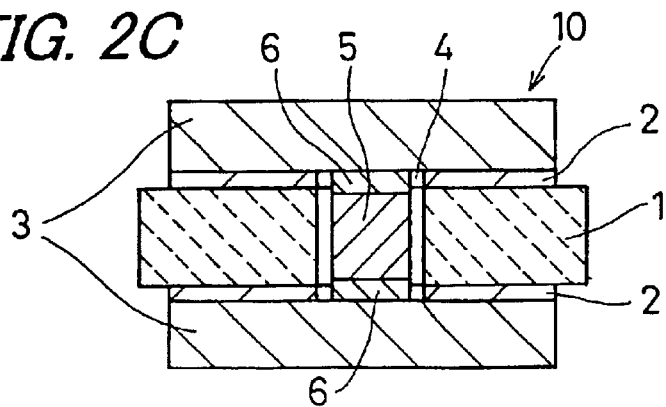

FIGS. 2A through 2C are sectional views showing one embodiment of a method for manufacturing a ceramic circuit board according to the invention, in a step-by-step manner.

In the method for manufacturing the ceramic circuit board 10 according to the invention, firstly, as shown in FIG. 2A, there are prepared a ceramic substrate 1 having a through hole 4; a metal column with brazing material 7 arranged within the through hole 4; and at least two pieces of metal circuit plates 3. The metal column with brazing material 7 is made 40 to 140 μm longer relative to the thickness of the ceramic substrate, by being formed of the metal column 5 which is 0 to 150 μm shorter relative to the thickness of the ceramic substrate 1 and has its both ends coated with a brazing material 6.

Subsequently, as shown in FIG. 2B, the metal column with brazing material 7 is arranged within the through hole 4 of the ceramic substrate 1, and then the metal circuit plates 3 are arranged on both surfaces of the ceramic substrate 1 in such a way as to stop up the through hole 4. The ceramic substrate 1 has its both surfaces coated with an active metal brazing material paste 8.

Lastly, as shown in FIG. 2C, the brazing material 6 of the metal column with brazing material 7 and the active metal brazing material paste 8 are molten by heating, so that the metal column 5 is bonded via the brazing material 6 to each of the metal circuit plates 3 attached to both surfaces of the ceramic substrate 1, and the ceramic substrate 1 is bonded via the active metal brazing material 2 to the metal circuit plates 3 attached to both surfaces thereof. In this way, the ceramic circuit board 10 can be realized that has basically the same structure as that shown in FIG. 1.

More specifically, in the method for manufacturing the ceramic circuit board 10 according to the invention, attachment of the metal circuit plate 3 to the ceramic substrate 1 having the through hole 4 using the active metal brazing material 2 is performed as follows. In the case of forming the metal circuit plate 3 from copper, there is prepared a silver-copper eutectic alloy added with titanium, zirconium, hafnium, or its hydride in an amount of 2 to 5 wt %. On the other hand, in the case of forming it from aluminum, there is prepared an aluminum-silicon eutectic alloy added with titanium, zirconium, hafnium, or its hydride in an amount of 2 to 5 wt %. An organic composition or solvent is mixedly added to the material prepared to form the active metal brazing material paste 8. Thereafter, as shown in FIG. 2B, the active metal brazing material paste 8 is print-coated both on one surface and on the other surface of the ceramic substrate 1 in a predetermined pattern, with a thickness of approximately 10 to 40 μm, using the conventionally-known screen printing method. Subsequently, the metal column with brazing material 7 is inserted and arranged within the through hole 4 of the ceramic substrate 1, and the metal circuit plate 3 is placed onto the active metal brazing material paste 8 print-coated on both surfaces of the ceramic substrate 1. Lastly, the assembly thus obtained is heated in a vacuum, or neutral atmosphere, or reducing atmosphere at a predetermined temperature (approximately 900° C. for copper, or 600° C. for aluminum), to melt the active metal brazing material paste 8 and the brazing material 6 coated at both end faces of the metal column 5. In this way, the ceramic substrate 1 and the metal circuit plate 3 are bonded together by the molten active metal brazing material 2, while the metal circuit plate 3 and the metal column 5 are bonded together by the molten brazing material 6.

In the method for manufacturing the ceramic circuit board according to the invention, the metal column with brazing material 7 in use is made 40 to 140 μm longer relative to the thickness of the ceramic substrate 1, by being formed of the metal column 5 which is 0 to 150 μm shorter relative to the thickness of the ceramic substrate 1 and has its both ends coated with the brazing material 6. In this case, since the length of the metal column 5 is 0 to 150 μm smaller than the thickness of the ceramic substrate 1, as described previously, it never occurs that the metal column 5 thrusts up the metal circuit plates 3 attached to both surfaces of the ceramic substrate 1. Thus, satisfactory bonding can be achieved between the ceramic substrate 1 and each of the metal circuit plates 3 attached to both surfaces thereof. Besides, since the length of the metal column with brazing material 7 is made 40 to 140 μm longer relative to the thickness of the ceramic substrate 1, the brazing materials 6 coated at both ends thereof make contact with their corresponding metal circuit plates 3 securely. Hence, during a subsequent melting process, the metal column 5 and the metal circuit plate 3 can be firmly bonded together via the brazing material 6, whereby making it possible to achieve highly reliable electrical bonding.

If the difference between the length of the metal column with brazing material 7 and the thickness of the ceramic substrate 1 is greater than 140 μm, even if the brazing materials 6 coated at both ends of the metal column 5 are molten, the metal circuit plate 3 is unable to sink sufficiently. As a result, the metal column 5 thrusts up the metal circuit plate 3, causing part of the metal circuit plate 3 located near the metal column 5 to rise. If the load for bonding is increased to forcibly bring the metal circuit plate 3 into a sunk state, the brazing material 6 finds its way into the space existing between the inner wall surface of the through hole 4 and the outer wall surface of the metal column 5. This makes it impossible for the space to accommodate the difference in thermal expansion between the ceramic substrate 1 and the metal column 5. By contrast, if the difference between the length of the metal column with brazing material 7 and the thickness of the ceramic substrate 1 is less than 40 μm, the metal column with brazing material 7 and each of the metal circuit plate 3 are in poor contact. Thus, even if the brazing materials 6, coated at both ends of the metal column with brazing material 7, are molten during the melting process, it may be impossible to achieve highly reliable electrical bonding between the metal column 5 and the metal circuit plate 3.

In view of the foregoing, it is preferable to employ the metal column with brazing material 7 that is made 40 to 140 μm longer relative to the thickness of the ceramic substrate 1, by being formed of the metal column 5 which is 0 to 150 μm shorter relative to the thickness of the ceramic substrate 1 and has its both ends coated with the brazing material 6. The metal column with brazing material 7, having its both ends coated with an adequate amount of brazing material 6 in advance, sustains less variation in the weight of the brazing material 6, and its use accordingly makes it possible to attain more stable bonding status and configuration, as compared with the method whereby supply of the brazing materials 6 to both ends of the metal column 5 is made after arranging the metal column 5 alone within the through hole 4, using the screen printing technique. As a result, highly reliable electrical bonding can be achieved.

The following is one example of how the metal column with brazing material 7 is fabricated. Firstly, a copper or aluminum ingot (block) is subjected to a conventionally-known metal processing method, such as the rolling process, stamping process, or drawing process, to form the metal column 5 of cylindrical shape. Thereafter, the metal column 5 has its both axial end faces coated with a silver brazing filler (where copper is used) or an aluminum brazing filler (where aluminum is used). Another example is as follows. Firstly, a brazing material plate and a copper plate, or an aluminum plate and a brazing material plate, are stacked together in the order named, and the stacked body is subjected to the rolling process so as to have a predetermined thickness. Thereafter, the metal processing method is practiced thereon, such as the stamping process or drawing process.

It should be noted that the invention need not be limited to the above-described embodiment and example, and therefore various changes and modifications are possible without departing from the spirit or scope of the invention.

For example, in the above-described embodiment, the metal circuit plate 3 is directly braze-bonded via the active metal brazing material 2 to the ceramic substrate 1. Alternatively, the ceramic substrate 1 may have its surface coated with a metallized layer such as tungsten or molybdenum. In this case, the metal circuit plate 3 is bonded via the brazing material to the metallized layer.

Moreover, in the above-described embodiment, the metal circuit plate 3 is given a predetermined circuit wiring pattern prior to being braze-bonded via the active metal brazing material 2 to the ceramic substrate 1. Alternatively, the metal circuit plate 3 may also be formed as follows. After brazing a metal plate having substantially the same shape as the ceramic substrate 1, an unnecessary metal portion is removed by etching, so that a predetermined circuit wiring pattern is defined.

Figure 3:
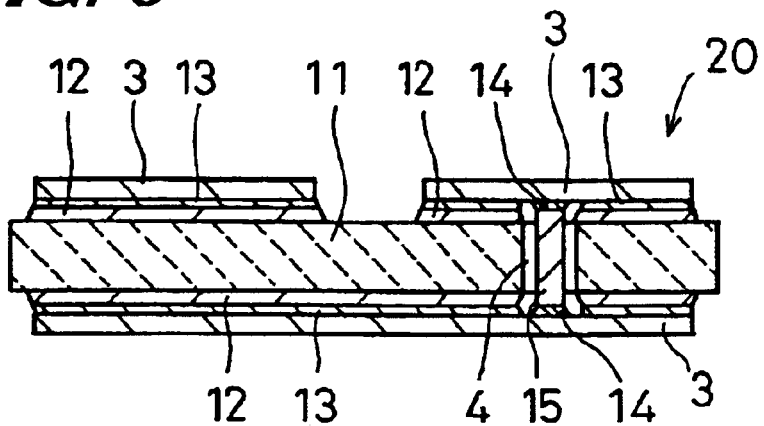
FIG. 3 is a sectional view showing another embodiment of the ceramic circuit board according to the invention.

FIG. 3 shows another embodiment of the ceramic circuit board according to the invention. The ceramic circuit board 20 includes a ceramic substrate 11, a metallized layer 12, and a metal circuit plate 3. Note that, in this embodiment, the components that play the same or corresponding roles as in the above-described embodiment will be identified with the same reference symbols.

The ceramic substrate 11 has a rectangular shape for example and has a through hole 4 drilled therethrough in the thickness direction. Within the through hole 4 is inserted and arranged a metal column 15.

Moreover, the ceramic substrate 11 has the metallized layers 12 coated both on its one surface and on the other surface opposite thereto. The metal circuit plate 3 is braze-bonded to the metallized layer 12.

The ceramic substrate 11 is made of an electrically insulating material such as sintered aluminum oxide, sintered mullite, sintered silicon carbide, sintered aluminum nitride, or sintered silicon nitride. In the case of using sintered aluminum oxide, the ceramic substrate 11 is fabricated as follows. Firstly, a suitable organic binder, plasticizer, or solvent is mixedly added to a starting powder material such as aluminum oxide, silicon oxide, magnesium oxide, or calcium oxide to form a slurry. The slurry is then formed into a ceramic green sheet (ceramic raw sheet) by the conventionally-known doctor blade method or calendar roll method. Secondly, the ceramic green sheet is subjected to an appropriate stamping process so as to be formed into a predetermined configuration with a hole acting as the through hole 4, and is thereafter fire data high temperature (approximately 1600° C.). Otherwise, a suitable organic composition or solvent is mixedly added to a starting powder material such as aluminum oxide to obtain adjusted starting powder. Thereafter, the starting powder is molded into a predetermined configuration with a hole acting as the through hole 4, using a press molding machine, and the molded body is fired at a temperature of approximately 1600° C.

The ceramic substrate 11, serving as a supporting member for supporting the metal circuit plate 3, has on its both surfaces the metallized layers 12 coated in a predetermined pattern, to which the metal circuit plates 3 of predetermined pattern are braze-bonded by the brazing material 14.

The metallized layer 12, serving as a base metal layer for braze-bonding the metal circuit plate 3 to the ceramic substrate 11, is made of a metal material having a high melting point, such as tungsten, molybdenum, or manganese. The metallized layer 12 is formed as follows for example. Firstly, a suitable organic binder, plasticizer, or solvent is mixedly added to tungsten powder to form a metal paste. The metal paste is print-coated both on one surface and on the other surface of the ceramic green sheet (ceramic raw sheet), which is formed into the ceramic substrate 11, in a predetermined pattern by firing in accordance with the conventionally-known screen printing method. Thereby, the metallized layers 12 are coated on both surfaces of the ceramic substrate 11 in a predetermined pattern, with a predetermined thickness.

It is preferable that the metallized layer 12 has its surface coated with a highly conductive metal material (nickel or gold, for example) which is highly corrosion-resistant and exhibits excellent wettability with respect to a brazing material, in a thickness ranging from 1 to 20 $\mu$m using the plating method. This makes it possible to effectively protect the metallized layer 12 against oxidative corrosion, and to considerably strengthen the braze-bonding of the metallized layer 12 to the metal circuit plate 3.

To each of the metallized layers 12, coated both on the upper surface and on the lower surface of the ceramic substrate 11, is attached the metal circuit plate 3 via the brazing material 13 in such a way as to stop up the through hole 4 formed in the ceramic substrate 11.

The metal circuit plate 3, made of copper or aluminum, is attached via the brazing filler 13 such as a silver brazing filler or aluminum brazing filler onto each of the metallized layers 12 coated both on the upper surface and on the lower surface of the ceramic substrate 11.

The copper- or aluminum-made metal circuit plate 3 is formed by subjecting a copper or aluminum ingot (block) to a conventionally-known metal processing method such as the rolling process or stamping process. The metal circuit plate 3 is formed in a predetermined pattern, with a thickness of 500 $\mu$m for example.

In the case of using copper, the metal circuit plate 3 should preferably be made of oxygen-free copper in particular. The metal circuit plate 3 made of oxygen-free copper is free from copper-surface oxidation caused by oxygen existing within the copper. Therefore, when braze-bonded, the metal circuit plate 3 exhibits excellent wettability with respect to the brazing material 13. As a result, the metal circuit plate 3 can be firmly bonded via the brazing material 13 to the metallized layer 12.

It is preferable that the metal circuit plate 3 has its surface coated with a highly conductive metal material such as nickel which is highly corrosion-resistant and exhibits excellent wettability with respect to the brazing material 13, using the plating method. This makes it possible to effectively protect the metal circuit plate 3 against oxidative corrosion, and to ensure that the metal circuit plate 3 is electrically connected to an external electric circuit and that an electronic component such as a semiconductor device is firmly connected to the metal circuit plate 3.

In a case where the metal circuit plate 3 has its surface plated with a layer made of nickel, the plate layer should preferably be made of a nickel-phosphorus amorphous alloy containing phosphorus in an amount of 8 to 15 wt %. This makes it possible to satisfactorily protect the surface of the plate layer against oxidation and thus maintain the wettability with respect to the solder and other advantage for a longer period of time.

Moreover, where the metal circuit plate 3 has its surface plated with a layer made of a nickel-phosphorus amorphous alloy, if the content of phosphorus relative to nickel is less than 8 wt % or exceeds 15 wt %, formation of the nickel-phosphorus amorphous alloy becomes difficult, with the result that the solder cannot be firmly bonded to the plate layer. Accordingly, where the metal circuit plate 3 has its surface plated with a layer made of a nickel-phosphorus amorphous alloy, the content of phosphorus relative to nickel should preferably be kept within a range of 8 to 15 wt %, more preferably, 10 to 15 wt %.

Further, if the nickel-made plate layer coated on the surface of the metal circuit plate 3 is less than 1.5 $\mu$m in thickness, the entire surface of the metal circuit plate 3 cannot be completely covered with the plate layer. This makes it impossible to effectively protect the metal circuit plate 3 against oxidative corrosion. By contrast, if the thickness of the plate layer exceeds 3 $\mu$m, an unduly large internal stress is developed inside the plate layer made of nickel, with the result that the ceramic substrate 11 suffers from warpage or crack. In particular, where the ceramic substrate 11 is made so thin as to have a thickness of 700 $\mu$m or below, it is inevitable that warpage or crack appears notably in the ceramic substrate 11. Thus, the thickness of the nickel-made plate layer coated on the surface of the metal circuit plate 3 should preferably be kept within a range of 1.5 to 3 $\mu$m.

Still further, the braze-bonding of the metal circuit plate 3 to the metallized layer 12 coated onto the ceramic substrate 11 is performed as follows. Firstly, on the metallized layer 12 is placed the metal circuit plate 3, with the brazing material 13 sandwiched therebetween that is made of for example a silver brazing filler (silver: 72 wt %, copper: 28 wt %) or an aluminum brazing filler (aluminum: 88 wt %, silicon: 12 wt %). Subsequently, the metal circuit plate 3 is heated in a vacuum, or neutral atmosphere, or reducing atmosphere at a predetermined temperature (ca. 900° C. for silver brazing filler, or ca. 600° C. for aluminum brazing filler), under a load of 30 to 100 g/cm$^2$, so as to melt the brazing material 13. In this way, the molten brazing material serves to bond together the metallized layer 12 and the metal circuit plate 3.

In the ceramic substrate 11 having the metal circuit plate 3 brazed thereto, inside the through hole 4 is arranged the metal column 15 which serves to provide electrical connection between the two metal circuit plates 3 braze-bonded both on one surface and on the other surface of the ceramic substrate 11.

The metal column 15 is made of highly conductive copper or aluminum having considerably low resistivity of 3 $\mu\Omega$·cm or below (copper: 1.72 $\mu\Omega$·cm; aluminum: 2.65 $\mu\Omega$·cm). Since the metal column 15 has low resistivity, that is, has small continuity resistance, even if large electric current exceeding 10A flows through the metal circuit plate 3 and the metal column 15, there occurs no liberation of considerable amounts of heat ascribable to resistive heat generation. As a result, an electronic component such as a semiconductor device, bond-fixed onto the metal circuit plate 3 using an adhesive such as solder, can be constantly kept at a suitable temperature so as to be operated normally and stably for a longer period of time.

The following is one example of how the metal column 15 is fabricated. Firstly, a copper or aluminum ingot (block) is subjected to a conventionally-known metal processing method, such as the rolling process, stamping process, or drawing process, to form the metal column 15 of cylindrical shape. Thereafter, the metal column 15 has its both axial end faces coated with a silver brazing filler (where copper is used) or an aluminum brazing filler (where aluminum is used). The metal column 15 is arranged within the through hole 4 formed in the ceramic substrate 11, with its both end faces bonded via the brazing material 14 to the metal circuit plates 3 attached both on one surface and on the other surface of the ceramic substrate 11.

In the case of using copper, the metal column 15 should preferably be made of oxygen-free copper in particular. The metal column 15 made of oxygen-free copper is free from copper-surface oxidation caused by oxygen existing within the copper. Therefore, when braze-bonded, the metal column 15 exhibits excellent wettability with respect to the brazing material 14. As a result, the metal column 15 can be firmly bonded via the brazing material 14 to the metal circuit plate 3.

If the metal column 15 is less than 200 $\mu$m in diameter, its continuity resistance is so large that, when large electric current exceeding 10A flows, considerable amounts of heat may possibly be liberated due to resistive heat generation. To avoid this dangerousness, the diameter of the metal column 15 should preferably be set at 200 $\mu$m or above, more preferably, 350 $\mu$m or above. Particularly, if the diameter of the metal column 15 is set at 350 $\mu$m or above, even if large electric current exceeding 20A flows through the metal column 15, there occurs no liberation of considerable amounts of heat ascribable to resistive heat generation. As a result, an electronic component such as a semiconductor device, bond-fixed onto the metal circuit plate 3 using an adhesive such as solder, can be constantly kept at a suitable temperature so as to be operated normally and stably for a longer period of time.

In the invention, it is important that, between the inner wall surface of the through hole 4 of the ceramic substrate 11 and the outer wall surface of the metal column 15 is secured a space which is 30 to 200 $\mu$m long.

Securing a 30 to 200 $\mu$m-long space between the inner wall surface of the ceramic substrate 11's through hole 4 and the outer wall surface of the metal column 15 confers the following advantage. When heat is applied to the ceramic circuit board 20, even if the outer wall surface of the metal column 15 is expanded and swollen due to the difference in thermal expansion coefficient between the ceramic substrate 11 and the metal column 15, the resultant expansion is successfully accommodated by the space. This helps prevent the inner wall surface of the through hole 4 from being pressed and expanded by the outer wall surface of the metal column 15, and thereby prevent occurrence of crack or fracture in the ceramic substrate 11. As a result, the ceramic circuit board 20 can be operated normally and stably for a longer period of time.

If the length of the space between the inner wall surface of the ceramic substrate 11's through hole 4 and the outer wall surface of the metal column 15 is less than 30 $\mu$m, when heat is applied to the ceramic circuit board, the inner wall surface of the ceramic substrate 11's through hole 4 is pressed and expanded by the outer wall surface of the metal column 15 swollen due to the difference in thermal expansion coefficient between the ceramic substrate 11 and the metal column 15. This leads to occurrence of crack or fracture in the ceramic substrate 11. By contrast, if the length exceeds 200 $\mu$m, when inserted into the through hole 4 of the ceramic substrate 11, the metal column 15 is tilted or toppled, causing difficulty in ensuring that the metal column 15 is firmly bonded to the metal circuit plate 3. Consequently, the continuity resistance between the metal circuit plate 3 and the metal column 15 becomes so large that, when large electric current exceeding 10A flows, considerable amounts of heat may possibly be liberated due to resistive heat generation, resulting in an electronic component such as a semiconductor device, bond-fixed onto the metal circuit plate 3, being driven into malfunction. To avoid this problem, the space between the inner wall surface of the ceramic substrate 11's through hole 4 and the outer wall surface of the metal column 15 is kept in a range of 30 to 200 µm in length.

As described hereinabove, according to the ceramic circuit board 20, an electronic component such as a semiconductor device is bond-fixed via an adhesive such as solder to the metal circuit plates 3 attached on both surfaces of the ceramic substrate 11, and further, each electrode of the electronic component such as a semiconductor device is electrically connected to the metal circuit plate 3 by way of electrical connecting means such as a bonding wire. Thereby, an electronic component such as a semiconductor device is mounted on the ceramic circuit board 20, and is simultaneously connected to an external electric circuit by electrically connecting the metal circuit plate 3 to the external electric circuit.

Next, still another embodiment of the invention will be described with reference to FIG. 4. Note that, in this embodiment, the components that play the same or corresponding roles as in the embodiment shown in FIG. 3 will be identified with the same reference symbols.

Figure 4:
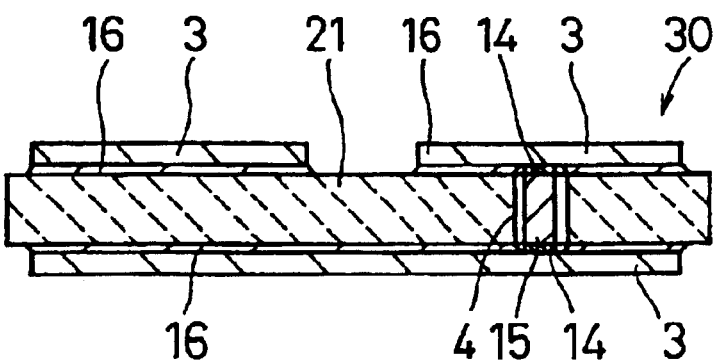
FIG. 4 is a sectional view showing still another embodiment of the ceramic circuit board according to the invention.

In a ceramic circuit board 30 shown in FIG. 4, metal circuit plates 3 of predetermined pattern are attached via an active metal brazing material 16 to both on one surface and on the other surface of a ceramic substrate 21. The ceramic substrate 21 has a through hole 4 drilled therethrough in the thickness direction. Within the through hole 4 is arranged a metal column 15, with its both end faces respectively attached via a brazing material 14 to the metal circuit plate 3.

The metal column 15, arranged within the through hole 4 formed in the ceramic substrate 21, has its both ends respectively bonded via the brazing material 14 to the metal circuit plate 3. With this arrangement, the two metal circuit plates 3 attached to both surfaces of the ceramic substrate 21 are electrically connected to each other via the metal column 15.

The ceramic substrate 21 having the through hole 4 is made of an electrically insulating material such as sintered aluminum oxide, sintered mullite, sintered silicon nitride, sintered aluminum nitride, or sintered silicon carbide. In the case of using sintered silicon nitride, the ceramic substrate 21 is fabricated basically in the same fashion as in the ceramic substrate 1 shown in FIG. 1.

Moreover, the ceramic substrate 21 has, on both of its one and the other surfaces, the metal circuit plates 3 attached via the active metal brazing material 16 in such a way as to stop up the through hole 4 formed in the ceramic substrate 21. The metal circuit plate 3, which is made of copper or aluminum, is formed by subjecting a copper or aluminum ingot (block) to a conventionally-known metal processing method such as the rolling process or stamping process. The metal circuit plate 3 is formed in a predetermined pattern, with a thickness of 500 µm for example.

In the case of using copper, the metal circuit plate 3 should preferably be made of oxygen-free copper in particular. The metal circuit plate 3 made of oxygen-free copper is free from copper-surface oxidation caused by oxygen existing within the copper. Therefore, when attached via the active metal brazing material 16, the metal circuit plate 3 exhibits excellent wettability with respect to the active metal brazing material 16. As a result, the metal circuit plate 3 can be firmly bonded via the active metal brazing material 16 to the ceramic substrate 21.

In the ceramic substrate 21, inside the through hole 4 is arranged the metal column 15 which serves to provide electrical connection between the two metal circuit plates 3 braze-bonded to both surfaces of the ceramic substrate 21.

The metal column 15 is arranged within the through hole 4 formed in the ceramic substrate 21, with its both end faces bonded via the brazing material to the metal circuit plates 3 attached to both surfaces of the ceramic substrate 21.

The metal circuit plates 3 are braze-bonded both on one surface and on the other surface of the ceramic substrate 21 using the active metal brazing material 16. This eliminates the need to form a metallized layer. The preferred materials for forming the active metal brazing material 16 includes, in the case of forming the metal circuit plate 3 from copper, a silver-copper eutectic alloy added with titanium, zirconium, hafnium, or its hydride in an amount of 2 to 5 wt %, and, in the case of forming the metal circuit plate 3 from aluminum, an aluminum-silicon eutectic alloy added with titanium, zirconium, hafnium, or its hydride in an amount of 2 to 5 wt %.

Attachment of the metal circuit plate 3 to the ceramic substrate 21 having the through hole 4 using the active metal brazing material 16 is performed as follows. In the case of forming the metal circuit plate 3 from copper, there is prepared a silver-copper eutectic alloy added with titanium, zirconium, hafnium, or its hydride in an amount of 2 to 5 wt %. On the other hand, in the case of forming it from aluminum, there is prepared an aluminum-silicon eutectic alloy added with titanium, zirconium, hafnium, or its hydride in an amount of 2 to 5 wt %. Then, an organic composition or solvent is mixedly added to the material prepared to form an active metal brazing material paste. Next, the active metal brazing material paste is print-coated both on one surface and on the other surface of the ceramic substrate 21 in a predetermined pattern, using the conventionally-known screen printing method. Subsequently, the metal column 15 is inserted and arranged within the through hole 4 of the ceramic substrate 21, and the metal circuit plate 3 is placed onto the active metal brazing material paste print-coated on both surfaces of the ceramic substrate 21. Lastly, the assembly thus obtained is heated in a vacuum, or neutral atmosphere, or reducing atmosphere at a predetermined temperature (approximately 900° C. for copper, or 600° C. for aluminum), so as to melt the active metal brazing material 16 and the brazing material coated at both end faces of the metal column 15. In this way, the molten active metal brazing material 16 serves to bond together the ceramic substrate 21 and the metal circuit plate 3, while the molten brazing material 14 serves to bond together the metal circuit plate 3 and the metal column 15.

In such a ceramic circuit board, like the above-described embodiment, the metal column 15 has low resistivity of 3 $\mu\Omega$·cm or below, that is, has small continuity resistance. Thus, even if large electric current exceeding 10A flows through the metal circuit plate 3 and the metal column 15, there occurs no liberation of considerable amounts of heat ascribable to resistive heat generation in the metal circuit plate 3 and the metal column 15. As a result, an electronic component such as a semiconductor device, bond-fixed onto the metal circuit plate 3 using an adhesive such as solder, can be constantly kept at a suitable temperature so as to be operated normally and stably for a longer period of time.

In the invention, it is important that, between the inner wall surface of the through hole 4 of the ceramic substrate 21 and the outer wall surface of the metal column 15 is secured a space which is 30 to 200 μm long.

Securing a 30 to 200 μm-long space between the inner wall surface of the ceramic substrate 21's through hole 4 and the outer wall surface of the metal column 15 confers the following advantage. When heat is applied to the ceramic circuit board 30, even if the outer wall surface of the metal column 15 is expanded and swollen due to the difference in thermal expansion coefficient between the ceramic substrate 21 and the metal column 15, the resultant expansion is successfully accommodated by the space. This helps prevent the inner wall surface of the through hole 4 from being pressed and expanded by the outer wall surface of the metal column 15, and thereby prevent occurrence of crack or fracture in the ceramic substrate 21. As a result, the ceramic circuit board 30 can be operated normally and stably for a longer period of time.

If the length of the space between the inner wall surface of the ceramic substrate 21's through hole 4 and the outer wall surface of the metal column 15 is less than 30 μm, when heat is applied to the ceramic circuit board 30, the inner wall surface of the ceramic substrate 21's through hole 4 is pressed and expanded by the outer wall surface of the metal column 15 swollen due to the difference in thermal expansion coefficient between the ceramic substrate 21 and the metal column 15. This results in crack or fracture being developed in the ceramic substrate 21. By contrast, if the length exceeds 200 μm, when inserted into the through hole 4 of the ceramic substrate 21, the metal column 15 is tilted or toppled, causing difficulty in ensuring that the metal column 15 is firmly bonded to the metal circuit plate 3. Consequently, the continuity resistance between the metal circuit plate 3 and the metal column 15 becomes so large that, when large electric current exceeding 10A flows, considerable amounts of heat may possibly be liberated due to resistive heat generation, resulting in an electronic component such as a semiconductor device, bond-fixed onto the metal circuit plate 3, being driven into malfunction. To avoid this problem, the space between the inner wall surface of the ceramic substrate 21's through hole 4 and the outer wall surface of the metal column 15 is kept in a range of 30 to 200 μm in length.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

It is claimed:

1. A ceramic circuit board comprising:
   a ceramic substrate having a through hole;
   a metal column arranged within the through hole, the metal column being made 0 to 150 μm shorter relative to a thickness of the ceramic substrate;
   a space between an inner wall surface of the through hole and an outer wall surface of the metal column defining a cavity, along the entire length of the metal column;
   metal circuit plates attached to both surfaces of the ceramic substrate in such a way as to stop up the through hole; and
   a brazing material interposed between the metal column and the metal circuit plate, for bonding together the metal column and the metal circuit plate.

2. The ceramic circuit board of claim 1, wherein the metal circuit plate is made of copper or aluminum.

3. The ceramic circuit board of claim 1, wherein the metal column is made of copper or aluminum.

4. The ceramic circuit board of claim 1, wherein a thickness of the cavity between the inner wall surface of the through hole and the outer wall surface of the metal column is kept in a range of 30 to 200 μm in length.

5. The ceramic circuit board of claim 1, wherein the metal circuit plate has its surface plated with a layer made of nickel.

6. The ceramic circuit board of claim 5, wherein the plate layer is made of a nickel-phosphorus amorphous alloy containing phosphorus in an amount of 8 to 15 wt %.

7. The ceramic circuit board of claim 5, wherein the plate layer is 1.5 to 3 μm thick.

8. The ceramic circuit board of claim 1, wherein the metal column has a diameter of 200 μm or above.

9. The ceramic circuit board of claim 1, wherein the metal column has a resistivity of 3 μΩ·cm or below.

* * * * *